United States Patent
Kim et al.

[11] Patent Number: 5,987,891
[45] Date of Patent: Nov. 23, 1999

[54] THERMOELECTRIC REFRIGERATOR/WARMER USING NO EXTERNAL POWER, AND REFRIGERATING/WARMING METHOD

[75] Inventors: Yong-Gyoo Kim; Chang-Ho Song; Kee-Sool Gam; Kee-Hoon Kang; Jeong-Hoon Lee, all of Daejeon-Si, Rep. of Korea

[73] Assignee: Korea Research Institute of Standards and Science, Daejem-Si, Rep. of Korea

[21] Appl. No.: 09/093,719

[22] Filed: Jun. 9, 1998

[30] Foreign Application Priority Data

Mar. 20, 1998 [KR] Rep. of Korea .......................... 98-9595

[51] Int. Cl.⁶ ................................... F25B 21/02
[52] U.S. Cl. .................... 62/3.6; 62/3; 62/3.7; 62/457; 62/457.7
[58] Field of Search ................ 62/3.6, 3.7, 457, 62/457.7

[56] References Cited

U.S. PATENT DOCUMENTS

| | | | |
|---|---|---|---|
| 4,326,383 | 4/1982 | Reed et al. | 62/3 |
| 4,364,234 | 12/1982 | Reed | 62/3 |
| 5,197,291 | 3/1993 | Levinson | 62/3.2 |
| 5,362,983 | 11/1994 | Yamamura et al. | 257/414 |
| 5,379,596 | 1/1995 | Grayson | 62/362 |
| 5,483,799 | 1/1996 | Dalto | 62/3.7 |
| 5,594,609 | 1/1997 | Lin | 361/104 |
| 5,603,220 | 2/1997 | Seaman | 62/3.7 |
| 5,715,684 | 2/1998 | Watanabe et al. | 62/3.2 |
| 5,860,281 | 1/1999 | Coffee et al. | 62/3.62 |

*Primary Examiner*—Henry Bennett
*Assistant Examiner*—Mark Shulman
*Attorney, Agent, or Firm*—Nikaido, Marmelstein, Murray & Oram, LLP.

[57] ABSTRACT

A thermoelectric refrigerator/warmer using no external power, and a refrigerating/warming method are disclosed. A natural energy such as the solar energy is utilized so as to make an external power needless. Thus a thermoelectric device is made to convert the natural energy into electric power based on the difference between the internal and external temperatures, and this electric energy is converted again into a thermal energy by means of a peltier device, thereby varying the internal temperature of the apparatus. An outer part 4 of a thermoelectric device 3 is attached on the side face of the refrigerator/warmer, and an inner part 5 of it is attached on a bottom plate 7 of the refrigerator/warmer. Thus a thermoelectromotive force is generated based on the temperature difference between outside and inside of the refrigerator/warmer. The voltage thus generated is supplied to a peltier device 6 to cool or heat the bottom plate 7. In this manner, the thermoelectric refrigerator/warmer can be operated even without using an external power.

19 Claims, 4 Drawing Sheets

THERMOELECTRIC REFRIGERATOR/ WARMER USING NO EXTERNAL POWER, AND REFRIGERATING/WARMING METHOD

BACKGROUND OF THE INVENTION

1. Field of the Invention

The present invention relates to a thermoelectric refrigerator/warmer using no external power, and a refrigerating/warming method. Particularly the present invention relates to a thermoelectric refrigerator/warmer using no external power, and a refrigerating/warming method, in which a natural energy is utilized so as to make an external power needless, and a peltier device and a thermoelectric device are coupled together so as to vary the internal temperature of the apparatus.

2. Description of the Prior Art

In the conventional refrigerator/warmer, an external power such as an ac power or a dc power is supplied to carry out a cooling or heating.

The home thermoelectric cooler or refrigerator/warmer uses the external power by converting the home ac power to a dc power, while the automobile refrigerator/warmer uses the power of a storage battery.

In these conventional methods, large amounts of electric power is consumed, and the power efficiency is low. Further, the apparatus cannot be used except that a power source is available.

Further, in the case of the home refrigerator/warmer, an ac-to-dc power converting device and a control means for adjusting the level of the dc power are necessarily required. Therefore, the structural constitution of the refrigerator/ warmer is complicated.

SUMMARY OF THE INVENTION

The present invention is intended to overcome the above described disadvantages of the conventional techniques.

Therefore it is an object of the present invention to provide a thermoelectric refrigerator/warmer using no external power, and a refrigerating/warming method, in which a natural energy such as the solar energy is utilized so as to make an external power needless, thus a thermoelectric device converts the natural energy into electric power based on the difference between the internal and external temperatures, and this electric energy is converted again into a thermal energy by means of a peltier device, thereby varying the internal temperature of the apparatus.

In achieving the above object, the refrigerating/warming method according to the present invention is characterized in that a thermoelectric device converts a natural energy into electric energy based on the difference between the internal and external temperatures, and this electric energy is supplied to a peltier device so as to carry out a thermal absorption or a thermal radiation, and the method is further characterized in that: the thermoelectric device consists of a plurality of thermocouples connected in series; a thermoelectromotive force generated at both ends of the thermoelectric device owing to the temperature difference is amplified to obtained a strong dc voltage; the voltage thus generated is supplied to a peltier device so as to carry out a thermal absorption or a thermal radiation; and thus an internal temperature of the refrigerator/warmer is automatically varied, so as to cool the interior of the apparatus if the external temperature is higher, and to carry out a heating if the external temperature is lower.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENT

The apparatus of the present invention will be described in detail referring to the attached drawings.

Figure 1:
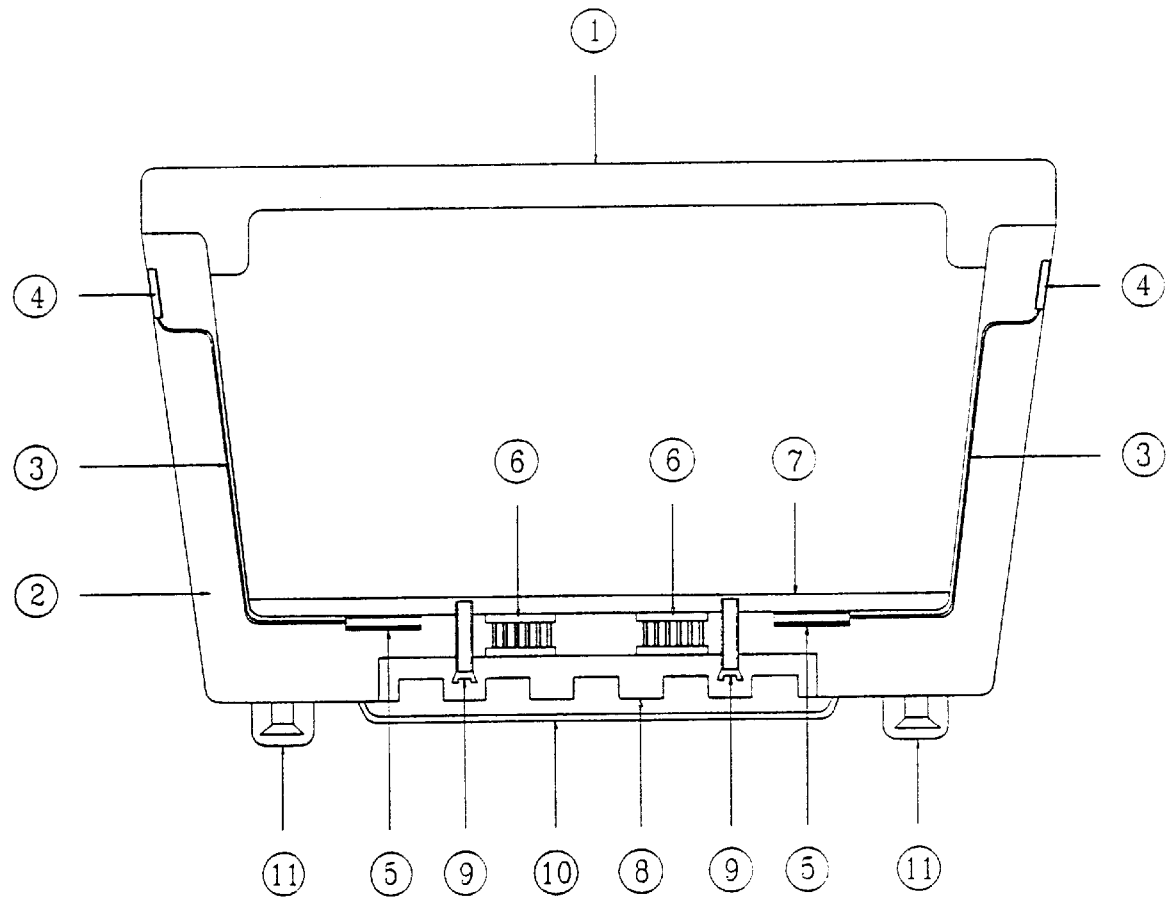
FIG. 1 is a sectional view of the powerless thermoelectric refrigerator/warmer according to the present invention.

FIG. 1 is a sectional view of the powerless thermoelectric refrigerator/warmer according to the present invention. The powerless thermoelectric refrigerator/warmer according to the present invention includes: a lid 1 for closing/opening when putting foods or the like; and a main body 2 for storing foods or the like.

A thermoelectric device 3 is attached on the side face of the main body 2, and an outer part 4 of the thermoelectric device 3 is installed on the outer wall of the main body 2.

The outer part 4 of the thermoelectric device 3 is attached to a high thermal conductivity metal such as an aluminum or copper plate, so that the response to the external temperature would be fast.

An inner part 5 of the thermoelectric device 3 is attached on a bottom plate 7 of the apparatus, so that it can respond to the variation of the internal temperature of the apparatus.

Between the outer part 4 and the inner part 5, there necessarily occurs a temperature difference. This temperature difference gives rise to a thermoelectromotive force, and this thermoelectromotive force is supplied to a peltier device 6.

The bottom plate 7 of the apparatus is made of an aluminum alloy plate coated with teflon, so that the thermal conductivity would be high, and that the corrosion resistance would be also high.

Further, the thermoelectric device 3 is attached on the side faces of the apparatus, so that the thermoelectromotive force would be generated at the four faces. Depending on the size of the refrigerator/warmer, the areas of the side faces are very wide, and therefore, a sufficient power can be obtained.

Figure 2:
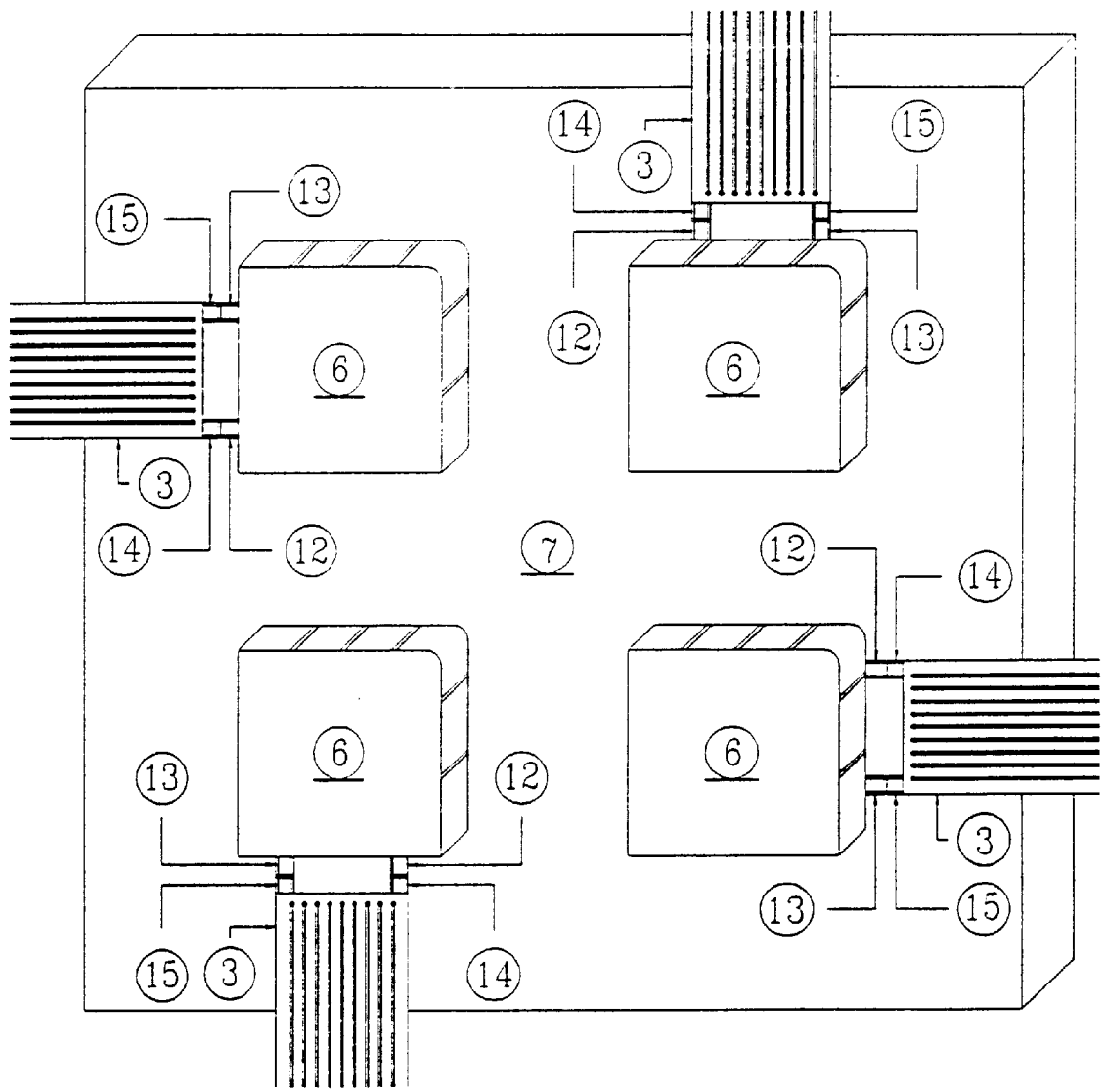
FIG. 2 is a perspective view showing the peltier device and the thermoelectric device attached on a bottom plate.

FIG. 2 is a perspective view showing a peltier device 6 attached on a bottom plate 7.

There are provided four peltier devices 6, so that they can receive the electric energy from all the side faces of the refrigerator/warmer.

The thermoelectric device 3 is coupled to the peltier device 6 by connecting an anode 12 and a cathode of the peltier device 6 to an anode contact 14 and a cathode contact 15 of the thermoelectric device 3.

In order to facilitate the thermal conduction between the bottom plate 7 and the peltier device 6, a thermally conductive adhesive is spread between the bottom plate 7 and the peltier device 6.

The arrangement of the peltier device 6 is formed in the following manner. That is, by taking into account the rectangular contour of the bottom plate 7, the total area of the bottom plate 7 is divided into four portions, so that each of peltier devices can cool or heat a particular one of the four portions.

That is, a plurality of the thermoelectric devices are coupled to a plurality of the peltier devices in such a manner as to form pairs, so that each pair can cool or heat independently.

Figure 3:
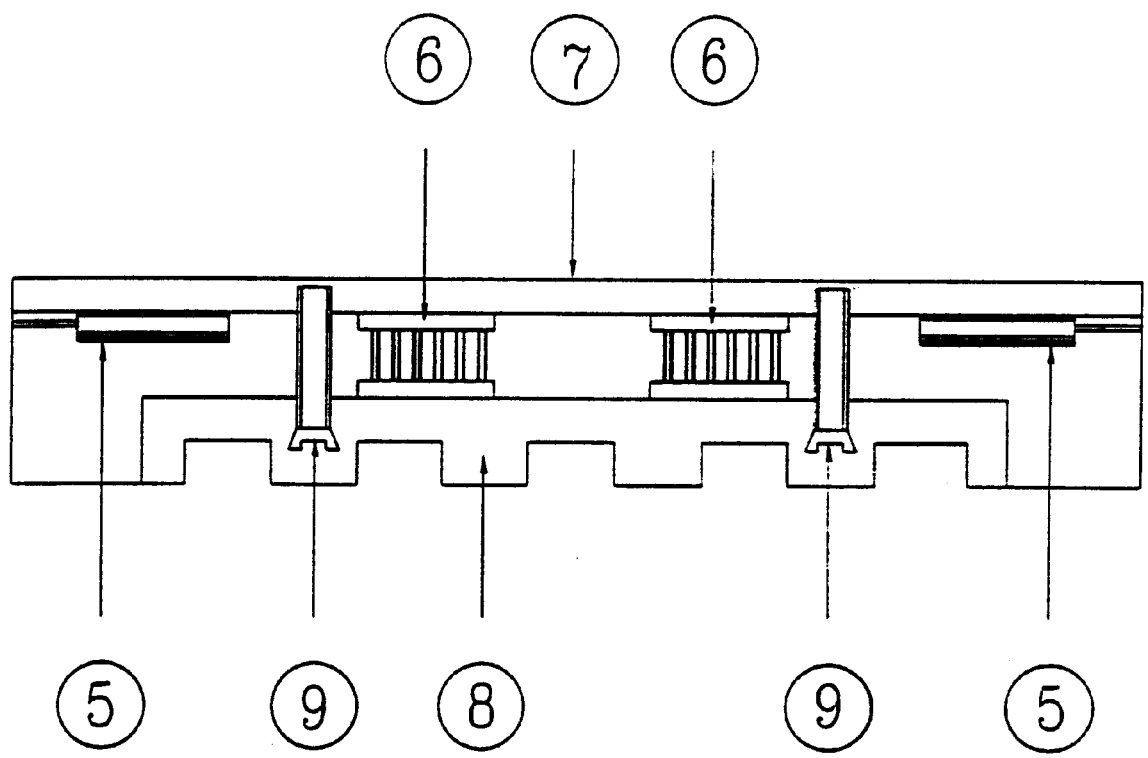
FIG. 3 is a sectional view showing the peltier device, the thermoelectric device, the bottom plate and the radiating plate coupled together.

FIG. 3 is a sectional view showing the peltier device 6, the inner part 5 of thermoelectric device, the bottom plate 7 and a radiating plate 8 coupled together.

In order to couple the peltier device 6 to the bottom plate 7 and the peltier device 6 to the radiating plate 8, bolts 9 are used which extend from the radiating plate 8 to the bottom plate 7. This is a measure against vibrations and external impacts.

Further, the bolt 9 improves the thermal contact between the peltier device 6 and the bottom plate 7, besides the above described purpose.

The radiating plate 8 is made of aluminum, and is fabricated by molding. The molded radiating plate makes it possible to radiate heat to the maximum degree.

Further, a protecting net 10 is installed to protect the radiating plate 8 from external impacts.

Figure 4:
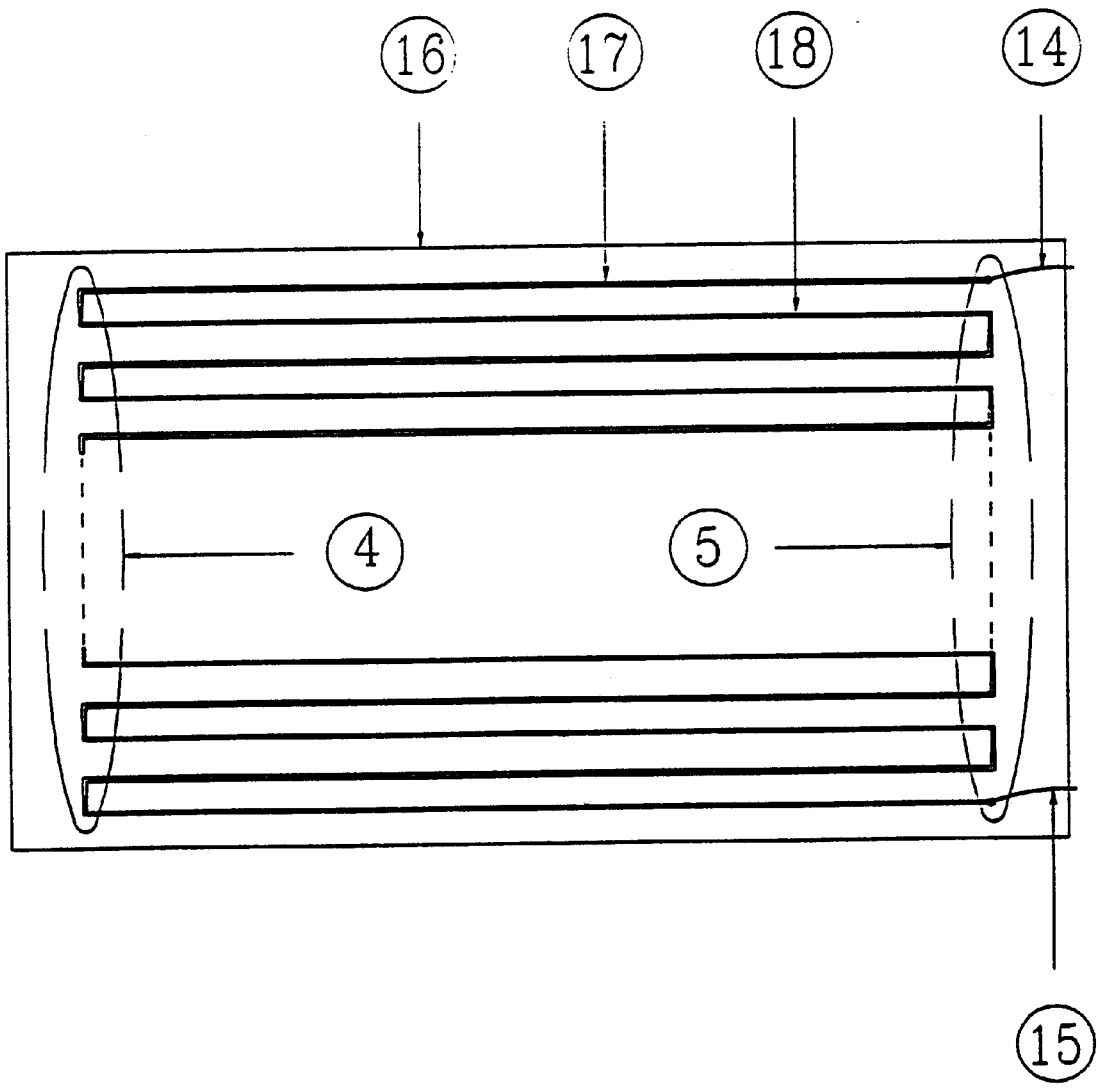
FIG. 4 is a plan view showing an example of the thermoelectric device.

FIG. 4 illustrates the shape of the thermoelectric device 3.

The thermoelectric device 3 includes a plurality of anodes 17 and a plurality of cathodes 18, and thus has a plurality of contacts.

In order to form a maximum number of contacts, the electrodes take the form of thin sheets, and the anodes 17 and the cathodes 18 are alternately arranged.

The anodes 17 and the cathodes 18 of the thermoelectric device are alternately arranged serially connected, and the anodes 17 are shifted to the cathodes 18 at the contact points of the outer part 4 and the inner part 5 of the thermoelectric device, while their numbers can be varied depending on the size of the refrigerator/warmer.

The base plate 16 of the thermoelectric device is made of an easily deformable, non-conductive and heat resistant material such as mica, capton, teflon, a heat resistant PVC or the like.

In order to increase the number of the contacts of the thermoelectric device 3, the thermoelectric devices are formed on both faces of the base plate 16.

The thermoelectric devices 3 are connected to the peltier devices 6 in the following manner. That is, the anode contact 14 of the thermoelectric device 3 is connected to the anode 12 of the peltier device 6, and the cathode contact 15 of the thermoelectric device 3 is connected to the cathode 13 of the peltier device 6, so that the generated voltages can flow in the forward direction.

In this case, if the external temperature is higher, a cooling phenomenon occurs, while if the external temperature is lower, then a thermal radiation occurs. Thus the internal temperature of the refrigerator/warmer is varied.

The apparatus (refrigerator/warmer) of the present invention constituted as described above can be summarized in the following form.

That is, in the powerless thermoelectric refrigerator/warmer including a lid 1 and a main body 2 and capable of cooling and heating in accordance with an abient temperature without using an external power according to the present invention, the main body includes: a thermoelectric device outer part 4 for responding to variations of an external temperature; a plurality of thermoelectric devices 3 formed on a base plate 16 and having an inner part 5 (as an end) capable of responding to an internal temperature of the refrigerator/warmer; a plurality of peltier devices 6 having anodes 12 and cathodes 13 connected to an anode contact 14 and a cathode contact 15 of the thermoelectric devices 3; a radiating plate 8 coupled to the peltier device 6, the peltier device 6 being attached on a bottom plate 7; a plurality of bolts 9 for fastening the peltier devices 6 to the radiating plate 8 as a measure against vibrations and external impacts; and a protecting net 10 for protecting a lower portion of the radiating plate 8, whereby the peltier devices 6 cool or heat by a thermoelectromotive force generated by the thermoelectric devices in accordance with variations of internal and external temperatures.

Now the refrigerating/warming method according to the present invention will be described.

A plurality of thermoelectric devices are utilized to convert the solar energy or the like to an electric energy based on the temperature difference between the outside and inside of the refrigerator/warmer. The converted electric energy is supplied to a plurality of peltier devices, so that thermal absorptions or thermal radiations would be carried out by the peltier devices. Each of the thermoelectric devices consists of a plurality of thermocouples connected in series, and the thermoelectromotive force which is generated across the both terminals of the thermoelectric device is amplified to obtain a large dc voltage. This power is supplied to the peltier devices which perform thermal absorptions or thermal radiations. Thus the internal temperature of the refrigerator/warmer is automatically varied in accordance with the temperature difference between the outside and inside of the refrigerator/warmer. That is, if the external temperature is high, the interior of the apparatus is cooled, while if the external temperature is low, a thermal radiation is done. As the thermal absorptions or the thermal radiations proceed by the function of the peltier devices, If the temperature difference becomes larger, and thus the refrigerating/warming efficiency is made to be increased, so that the refrigerating/warming can be carried out by the naturally formed temperature difference even without using an external power.

Now the operation of the refrigerator/warmer of the present invention will be described.

When the thermal absorptions or the thermal radiations are made to proceed by the peltier devices based on the temperature difference between the outside and inside, the temperature difference is more and more increased, with the result that the refrigerating/warming efficiency is increased.

For example, at the initial stage, if the external temperature is higher than the internal temperature by about 10 C, then a thermoelectromotive force corresponding to 10 C is generated. Then the thermoelectromotive force thus generated drives the peltier devices to make the internal temperature of the refrigerator/warmer dropped.

Then the internal temperature thus dropped increases the temperature difference further, so as to generate a larger thermoelectromotive force. Then correspondingly to this, the voltage supplied to the peltier devices is strengthened, with the result that the refrigerating efficiency of the peltier devices is further increased.

Ultimately, the internal temperature of the refrigerator/warmer reaches the lowest point based on the performance index of the peltier devices and on the heat-insulating properties of the refrigerator/warmer.

According to the present invention as described above, the powerless thermoelectric refrigerator/warmer can be operated even without using an external power. That is, the solar energy or the like is converted into an electric energy by the thermoelectric devices based on the temperature difference between the outside and inside of the refrigerator/warmer. Then the converted electric energy is supplied to a plurality of the peltier devices to convert the electric energy to a thermal energy again. In this manner, in summer seasons, the external temperature can be made higher than the internal temperature, by about 10° C., while in winter seasons, the external temperature can be made lower than the internal temperature by about 10° C.

What is claimed is:

1. A thermoelectric refrigerator/warmer including a lid and a main body and capable of cooling and heating in accordance with an ambient temperature without using an external electric power source, said main body comprising:

a plurality of thermoelectric devices each having an inner part located adjacent to or connected by a heat conductor to an internal portion of said refrigerator/warmer and an outer part located adjacent to or connected by a heat conductor to an exterior of said refrigerator/warmer;

a plurality of peltier devices each having anodes and cathodes connected to an anode contact and a cathode contact of at least one of said thermoelectric devices;

whereby said peltier devices cool or heat by a thermoelectromotive force generated by said thermoelectric devices in accordance with a temperature difference between said internal portion and the exterior of said refrigerator/warmer.

2. The thermoelectric refrigerator/warmer as claimed in claim 1, wherein each of said thermoelectric devices comprises a plurality of thermocouples, and a thermoelectromotive force is generated across two ends of each of said thermocouples due to said temperature difference.

3. The thermoelectric refrigerator/warmer as claimed in claim 1, wherein said outer part of each of said thermoelectric devices are attached on side faces of said refrigerator/warmer.

4. The thermoelectric refrigerator/warmer as claimed in claim 1, wherein said thermoelectric devices are attached on exterior side faces of said refrigerator/warmer.

5. A thermoelectric refrigerator/warmer as claimed in claim 1, wherein said inner part is defined by said lid and main body, and wherein said main part further comprises:

a radiating plate;

and a plurality of bolts fastening said plurality of peltier devices between said radiating plate and said bottom plate; and a protective net placed adjacent to said radiating plate.

6. The thermoelectric refrigerator/warmer as claimed in claim 1, wherein said peltier devices installed on said bottom plate are arranged by dividing said bottom plate into four areas, one of said peltier devices being disposed on each area.

7. The thermoelectric refrigerator/warmer as claimed in claim 1, wherein said bottom plate is made of a teflon-coated aluminum alloy sheet.

8. The thermoelectric refrigerator/warmer as claimed in claim 1, wherein the plurality of said thermoelectric devices and the plurality of said peltier devices are provided in a one-to-one ratio to form pairs, each pair performing an independent refrigerating or heating function.

9. The thermoelectric refrigerator/warmer as claimed in claim 1, wherein said thermoelectric devices are made of thin sheets, and are provided with a plurality of contacts.

10. The thermoelectric refrigerator/warmer as claimed in claim 1, wherein said base plate is made of an easily deformable, electrically non-conductive, and heat resistant material selected from a group consisting of mica, capton, teflon, and a heat resistant PVC.

11. The thermoelectric refrigerator/warmer as claimed in claim 1, wherein each of said plurality of thermoelectric devices are formed on a base plate and anodes and cathodes of said thermoelectric devices are formed on each of front and rear faces of said base plate.

12. The thermoelectric refrigerator/warmer as claimed in claim 1, wherein an anode contact of each of said thermoelectric devices is connected to an anode of a corresponding peltier device, and a cathode contact of each of said thermoelectric devices is connected to a cathode of a corresponding peltier device to make the generated voltage flow in a forward direction, so as to cool if an external temperature is high relative to an internal temperature, and so as to heat if the external temperature is low relative to the internal temperature.

13. The thermoelectric refrigerator/warmer as claimed in claim 1, wherein anodes and the cathodes of the thermoelectric devices are alternately arranged and serially connected, and the anodes are connected to the cathodes at the contact points located at the outer part and the inner part of the thermoelectric device, the number of anodes and cathodes depending on a size of said refrigerator/warmer.

14. A refrigerating/warming method wherein thermoelectric devices including a plurality of thermocouples connected in series, convert a natural energy into electric energy based on a temperature difference of internal and external temperatures, and this electric energy is supplied to peltier devices so as to carry out thermal absorptions or thermal radiations, comprising:

generating a thermoelectromotive force between two ends of each of said thermoelectric devices due to the temperature difference to obtain a dc voltage; and supplying the generated dc voltage to said peltier device so as to carry out a thermal absorption or a thermal radiation;

whereby an internal temperature of said refrigerator/warmer is automatically controlled, so as to cool an interior of said apparatus if the external temperature is higher than the internal temperature, and to carry out a heating if the external temperature is lower than the internal temperature.

15. A thermoelectric refrigerator/warmer as claimed in claim 5, further comprising:

a bottom plate adjacent to said inner part.

16. The thermoelectric refrigerator/warmer as claimed in claim 5, wherein said inner part of each of said thermoelectric devices is attached on said bottom plate of said refrigerator/warmer.

17. The thermoelectric refrigerator/warmer as claimed in claim 2, wherein, in each thermoelectric device, said plurality of thermocouples are connected in series, the thermoelectromotive force generated across the two ends of each thermocouple being added and applied to one of said plurality of peltier devices.

18. The thermoelectric refrigerator/warmer as claimed in claim 1, wherein, said plurality of peltier devices are in thermal communication with said internal portion to cool or heat said internal portion.

19. A thermoelectric refrigerator/warmer comprising:

a container;

a thermoelectric device having a first portion in thermal communication with an interior of said container and a second portion in thermal communication with an exterior of said container;

a peltier device connected to said thermoelectric device, in thermal communication with the interior of said container to heat or cool the interior of said container in response to a thermoelectromotive force generated by said thermoelectric device in accordance with a temperature difference between the interior of the container and the exterior of the container.

* * * * *